United States Patent [19]

Owen

[11] Patent Number: 4,961,184
[45] Date of Patent: Oct. 2, 1990

[54] INTEGRATE AND HOLD AMPLIFIER

[75] Inventor: Jeffrey R. Owen, Portland, Oreg.

[73] Assignee: AT&E Corporation, San Francisco, Calif.

[21] Appl. No.: 304,526

[22] Filed: Jan. 31, 1989

[51] Int. Cl.[5] .......................... H04J 1/00; H04B 1/10; H04B 3/0; H03K 5/00
[52] U.S. Cl. ..................................... 370/76; 370/69.1; 455/307; 333/19; 328/151
[58] Field of Search .................... 455/307; 370/76, 94, 370/60, 69.1, 120; 333/173, 19; 328/151; 307/112

[56] References Cited

U.S. PATENT DOCUMENTS 4,039,979 8/1977 Carbrey .............................. 333/173
4,322,697 3/1982 Carbrey .............................. 333/173

OTHER PUBLICATIONS

Operational Amplifiers, The Devices and Their Applications, Charles F. Wojslaw, Evangelos A. Moustakas, 1986, pp. 320-322.

Primary Examiner—Douglas W. Olms
Assistant Examiner—Christopher O. Edwards
Attorney, Agent, or Firm—Elmer W. Galbi

[57] ABSTRACT

The present invention relates to a system which uses information in a certain band of frequencies, $f_b$. The information of interest is contained in an analog signal that has noise at higher frequencies. The analog signal is sampled using an integrate and hold amplifier, hence, noise from higher frequencies is aliased into the region of interest $f_b$. In accordance with the present invention, the integrated and hold amplifier has a frequency response which has a zero at a frequency, $f_n$, which is one of the frequencies aliased into the band of frequencies $f_b$. Thus, the effect of the noise that appears near the frequency $f_n$ has much less effect on the signal when it is aliased into the frequency band of interest, $f_b$. The performance of the system is thereby improved.

15 Claims, 3 Drawing Sheets

INTEGRATE AND HOLD AMPLIFIER

FIELD OF THE INVENTION

The present invention relates to electronic circuitry and, more particularly, to an integrate and hold amplifier which reduces aliased noise.

BACKGROUND OF THE INVENTION

Digital filters are often used to separate or subdivide a continuous time signal into frequency determined portions for subsequent analysis or signal processing. In order to pass an analog signal through a digital filter, the analog signal must first be sampled and then digitized.

Conventional techniques use sampling frequencies sufficiently above the highest frequency of interest so that no significant information is lost in the sampling process. Generally, one tries to use the highest possible sampling frequency and the shortest possible sampling interval in order to most accurately represent the analog signal. However, the sampling frequency is limited by the characteristics of the electronic circuitry and futhermore, the sampling frequency is often a function of cost.

It is well known that the sampling of a continuous time signal produces the phenomenon of frequency aliasing into the signal's frequency spectrum. Frequency aliasing divides the frequency spectrum into sections which are overlaid, thereby in effect folding the frequency spectrum onto itself. Frequencies that are offset by integer multiples of the sampling frequency are overlaid upon each other. This often causes interference, in the form of noise and/or distortion which is overlaid onto the desired signal.

OBJECTS AND ADVANTAGES OF THE PRESENT INVENTION

It would be advantageous to provide a method for reducing signal interference caused by frequency aliasing that occurs as a consequence of sampling.

It would also be advantageous to eliminate at least the most significant contributor of noise due to frequency aliasing and if possible reduce the others.

SUMMARY OF THE INVENTION

The present invention relates to a system which uses information in a certain band of frequencies, $f_b$. The information of interest is contained in an analog signal that has noise at higher frequencies. The analog signal is sampled using an integrate and hold amplifier, hence, noise from higher frequencies is aliased into the region of interest $f_b$. In accordance with the present invention, the integrate and hold amplifier has a frequency response which has a zero at a frequency, $f_n$, which is one of the frequencies aliased into the band of frequencies $f_b$. Thus, the noise that appears near the frequency $f_n$ has much less effect on the signal when it is aliased into the frequency band of interest, $f_b$. The performance of the system is thereby improved.

BRIEF DESCRIPTION OF THE DRAWINGS

A complete understanding of the present invention may be obtained by reference to the accompanying drawings, when taken in conjunction with the detailed description thereof and in which.

DESCRIPTION OF THE PREFERRED EMBODIMENT

In the preferred embodiment of the invention described herein the invention is applied to a paging system of the type shown in U.S. Pat. No. 4,713,808 issued to Gaskill et al and copending patent application Ser. No. 07/121,139, filed Nov. 16, 1987, now abandoned, both of which are hereby incorporated by reference.

Figure 1:
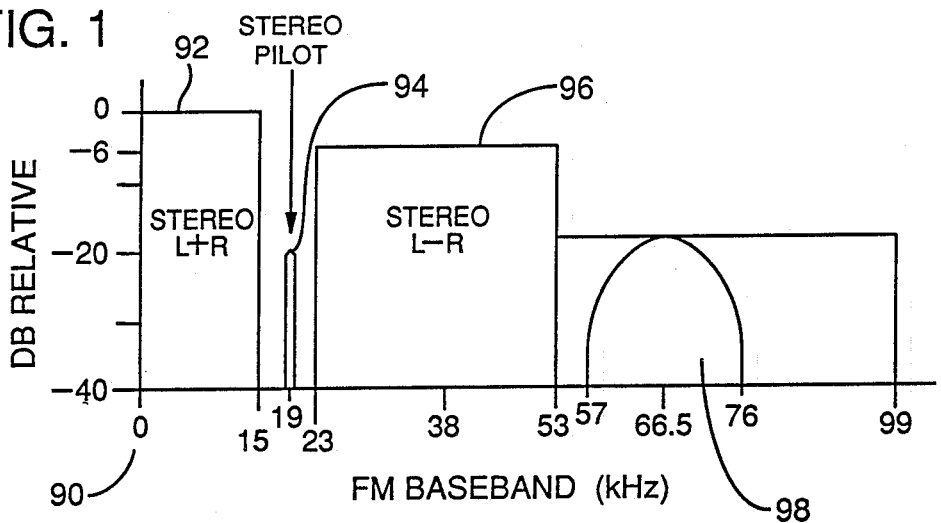
FIG. 1 is a diagram showing FM baseband spectrum.

Referring now to FIG. 1, there are shown the spectral components of a demodulated wideband FM broadcast signal of the type used by the system shown in the above referenced patent and patent applications. For simplicity, only the positive frequencies are shown.

In the U.S., FM radio stations broadcast within the frequency range of 88 MHz to 108 MHz. Each station is allotted 200 kHz of bandwidth, which is occupied by a carrier frequency modulated by a baseband signal of 0 kHz to 99 kHz. The stereo audio signal uses 0 kHz to 53 kHz and contains "left plus right" signal 92, the pilot signal 94 and the "left minus right" signal 96.

The spectrum between 57 kHz and 76 kHz is used in the present embodiment of the invention to transmit a Subsidiary Communication Authorization (SCA) or subcarrier signal 98. As described in the previously referenced patent and patent application, SCA signal 98 is modulated with data.

Figure 2:
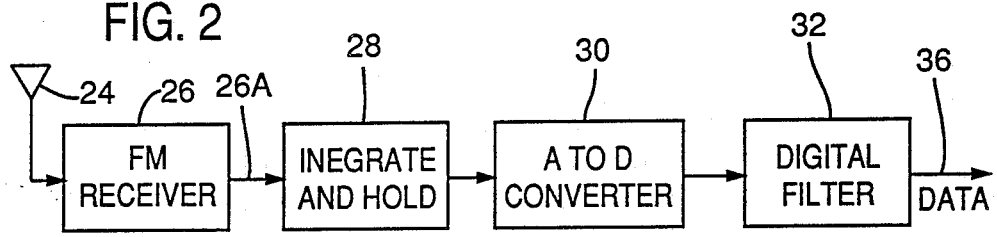
FIG. 2 is a block diagram of a data receiving system.

Referring now to FIG. 2, there is shown a block diagram of a radio receiver of the type shown and described in the previously referenced patent and patent application. As shown in FIG. 2, a receiving antenna 24 is connected to an FM receiver 26. FM receiver 26 produces a baseband audio signal 26A which contains the components shown in FIG. 1 plus undesirable noise energy which extends beyond 100 kHz.

The base band audio signal 26A is applied to the input of integrate and hold amplifier 28, the function and operation of which is described in greater detail hereinbelow. The output of integrate and hold amplifier 28 is applied to an analog to digital (A/D) converter 30 and the resultant digital signal is applied to an FIR digital filter 32 which has a pass band from 57 to 76 kHz. The output of filter 32 is the desired data on line 36.

The sampling rate of the integrate and hold amplifier 28 is 133 kHz. The resulting frequency aliasing overlays the entire frequency spectrum onto a total bandwidth of 133 kHz (−66.5 kHz to +66.5 kHz). The part of the spectrum between the subcarrier frequency 66.5 kHz and three times that frequency (199.5 kHz) is folded back into bandwidth −66.5 kHz to +66.5 kHz. Similarly, the part of the spectrum between −199.5 kHz and −66.5 kHz is also folded back into the spectrum bandwidth −66.5 kHz to +66.5 kHz. Thus, any noise in the region around 199.5 kHz will be overlaid onto the SCA signal 98.

Figure 3:
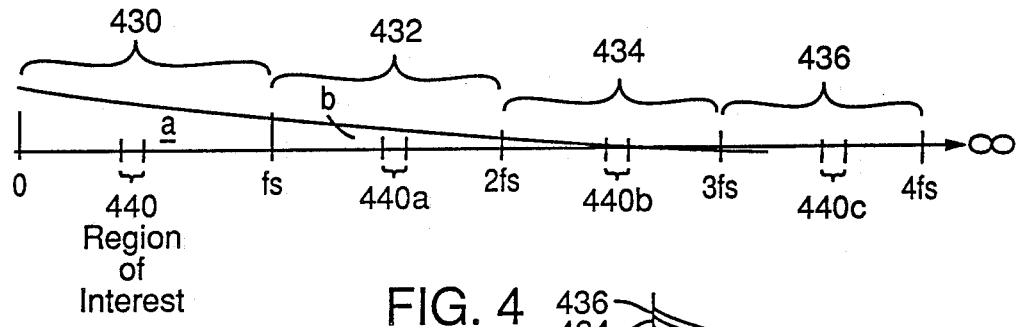
FIG. 3 is a diagram showing a potential noise spectrum.

Referring to FIG. 3, there is shown the continuous frequency spectrum of the type of noise that might be included with the baseband signal 26A. Four 133 kHz wide intervals are identified by reference numerals 430, 432, 434, and 436. Naturally it should be understood that the range extends to an infinite frequency but that for simplicity only four regions are shown. Within the first frequency interval 430, the region of interest 440 appears. This represents a region or range of frequency in which information to be extracted appears.

Figure 4:
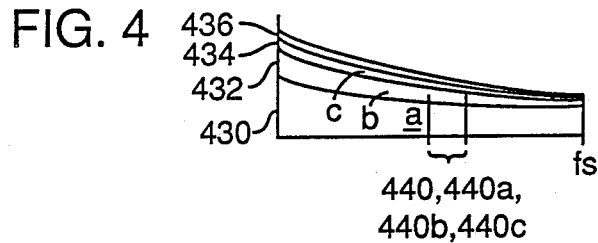
FIG. 4 is a diagram showing the aliased noise spectrum.

FIG. 4 shows the result of frequency aliasing on the continuous spectrum of FIG. 3. The entire spectrum is divided into segments of 133 kHz width which are overlaid on one another, so that the full spectrum of frequencies is essentially folded in on itself. Region of interest 440 is overlaid with corresponding ranges of frequency 440a, 440b and 440c. Any noise, distortion or other signals in ranges of frequencies 440a, 440b or 440c which overlay the region of interest 440 will contribute to the total noise, distortion or other interference. The present invention minimizes or eliminates the effects of what is generally the most significant contributor of this interference, in this embodiment, region 440a; and reduces the effects of the other contributors 440b and 440c.

Figure 5:
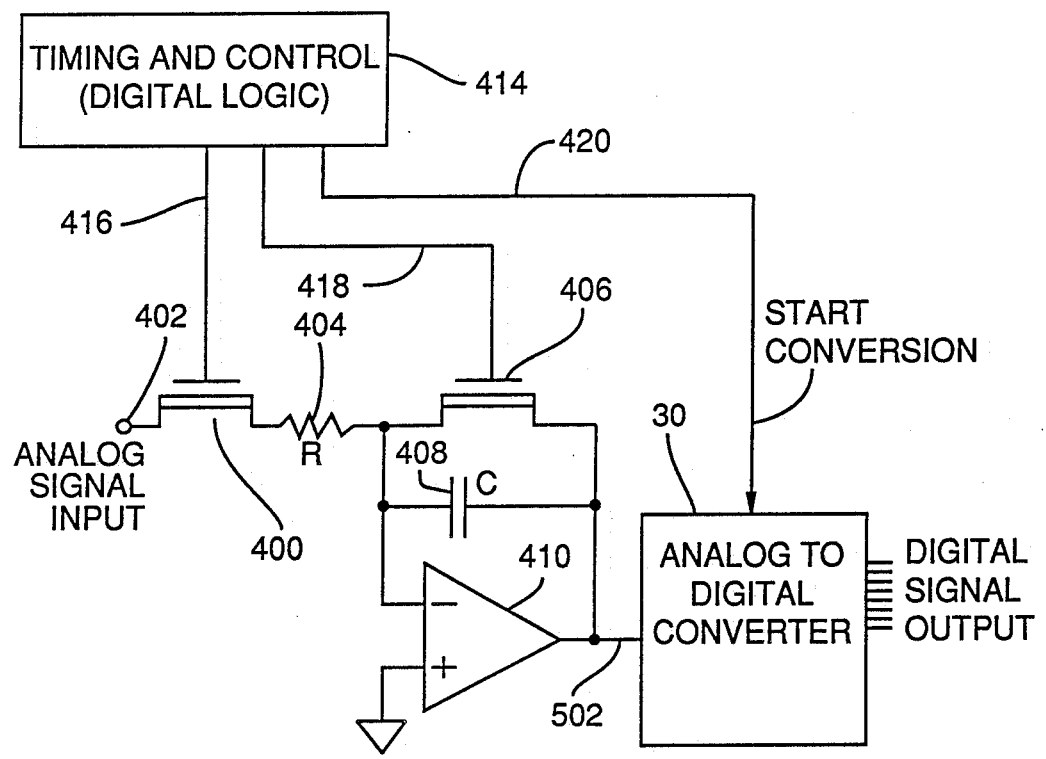
FIG. 5 is a schematic diagram of a preferred embodiment of an integrate and hold amplifier.

Referring now to FIG. 5, there is shown a schematic diagram of the integrate and hold amplifier of the present invention. An amplifier 410, a resistor 404 and a capacitor 408 are arranged in the form of a classic integrator. A switch 400 is provided to allow the circuit to integrate input voltage levels over a controlled period of time. Another switch 406 is used to discharge the voltage of the integrating/holding capacitor 408.

The output signal of amplifier 410 (i.e. signal 502) is applied to an analog to digital (A/D) converter 30.

Suitable timing and control logic 414 is provided to control the operation of switch 400 over line 416, the operation of switch 406 over line 418 and the operation of A/D converter 30 (i.e., when A/D conversion should begin) over line 420. Timing and control unit 414 includes digital logic circuitry. Since such details can be readily supplied by those with skill in the art of digital logic design, such details are not described further herein.

Figure 6:
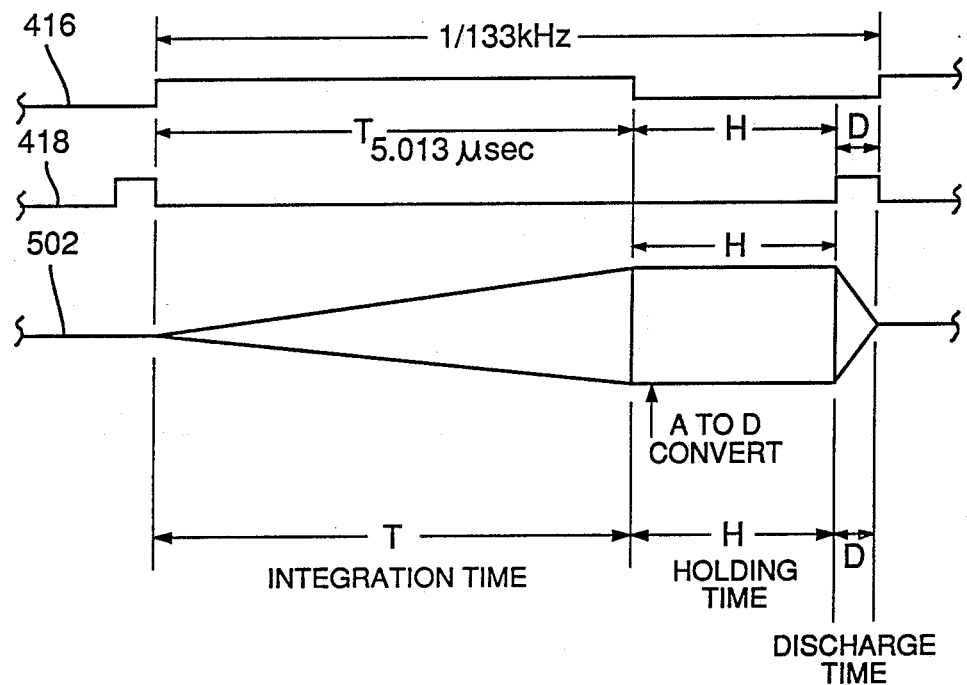
FIG. 6 is a timing diagram of the circuit of FIG. 5.

The operation of the circuit of the present invention can be appreciated more fully with reference to FIG. 6, which depicts a timing diagram of circuit operation. At the beginning of a cycle, timing and control unit 414 (FIG. 5) closes switch 400 for a time duration of "T". During time "T", the analog input signal is integrated. The output signal 502 may be changing during the time interval "T". After the time interval "T" has elapsed, switch 400 is opened, and signal 502 is held constant for the time interval "H". The analog to digital conversion by A/D converter 30 takes place during interval "H". Operation of A/D converter 30 is initiated by circuit 414 through a signal on line 420.

As a final step, switch 406 is closed by a signal on line 418, for a time "D", and the voltage on line 502 rapidly approaches zero in preparation for the next cycle.

The output voltage held on line 502 during the time interval "H" can be expressed as the following integration equation:

$$V_o = \frac{1}{RC} \int_T^{V_{in}} dt$$

where
$V_o$ is the voltage on line 502
$V_{in}$ is the voltage on line 402 and
where R and C are values of resistor 404 and holding capacitor 408, respectively. The values of these components are chosen to yield a desired integrator gain. In this embodiment, the value T (5.013 μsec) is chosen to be ⅓ the period of a full cycle at 66.5 kHz.

It should be noted that by setting the value of R equal to zero, the circuit integrates the current applied to its input rather than the voltage applied to its input, the basic operation, however, remains the same.

Figure 7:
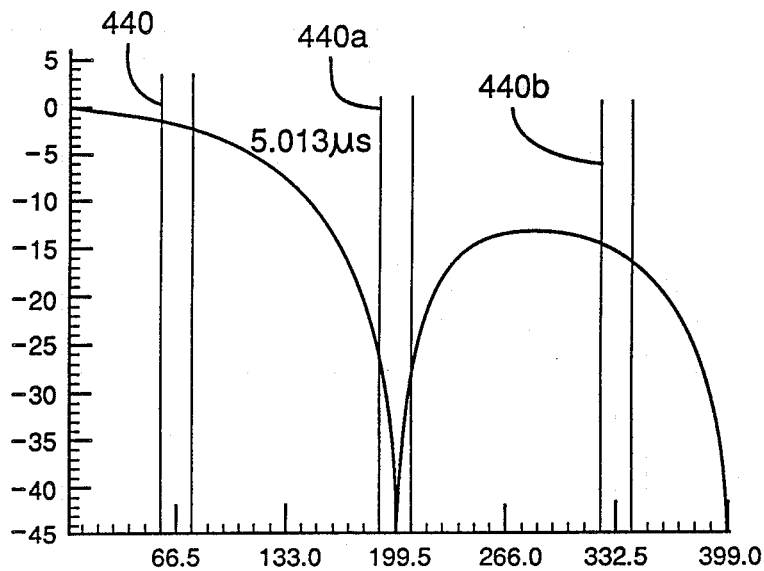
FIG. 7 is the frequency response of the integrate and hold amplifier.

Referring now to FIG. 7, there is shown the frequency response curve of the integrate and hold circuit. The region of interest 440 is centered at 66.5 kHz. Sampling the signal at twice this frequency (133 kHz) results in aliasing of frequencies in the regions of 199.5 kHz and 332.5 kHz into region of 66.5 kHz. By choosing 5.013 microseconds for the value for T in the aforementioned integration expression, the frequency response will have a zero value at 199.5 kHz, thus attenuating to a large degree the noise or interference contained in the frequency range 440a. As also shown, the noise or interference in the frequency range 440b is attenuated.

From the foregoing description, it can be seen that the present invention relates to a system which includes an integrate and hold circuit and other circuitry which uses a data signal present in a relatively narrow band of frequencies. The aliasing produced by sampling causes the higher frequencies to be overlayed onto the lower frequencies. Thus, noise or other interference from the higher frequencies will be aliased to the frequency band which carries the data used by the system. With the present invention, the effect of the noise at the higher frequencies is minimized by providing an integrate and hold circuit which has a frequency response of zero at one of the frequencies which is aliased into the frequency band of interest. This reduces the amount of noise that is aliased into the frequency region of interest.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

What is claimed is:

1. A system including in combination:
   means for receiving an analog signal which has a data signal component located in a relatively narrow frequency band,
   an integrate and hold circuit which samples said data signal,
   said integrate and hold circuit having an integrate time such that the frequency response of said integrate and hold circuit has a zero located at a frequency which is aliased into said relatively narrow frequency band,
   whereby interference due to noise from higher frequencies is minimized.

2. The system in accordance with claim 1 wherein said integrate and hold circuit comprises:
   (a) an analog switch for controlling an integration cycle;
   (b) an amplifier subcircuit operatively connected to said analog switch; and
   (c) a resistor connected between said analog switch and said amplifier subcircuit.

3. The system in accordance with claim 2 wherein said amplifier subcircuit comprises an amplifier, a capacitor and a capacitor discharge switch connected in parallel with one another.

4. The system in accordance with claim 3 wherein said integrate and hold circuit further comprises:
   (d) timing and control means operatively connected to said analog switch and to said capacitor discharge switch for controlling operation thereof.

5. The system in accordance with claim 4 wherein said integrate and hold circuit further comprises:
   (e) an analog-to-digital converter operatively connected to said amplifier subcircuit.

6. The integrate and hold circuit in accordance with claim 5 wherein operation of said analog-to-digital converter is controlled by said timing and control means.

7. An integrate and hold amplifier for reducing signal interference at a region of interest comprising:
   (a) an analog switch for controlling the duration of an integration cycle;
   (b) an amplifier subcircuit operatively connected to said analog switch, said subcircuit comprising an amplifier, a capacitor and a capacitor discharge switch connected in parallel with one another;
   (c) a resistor connected between said analog switch and said amplifier subcircuit; and
   (d) said integration cycle being timed to produce a zero response of said integrate and hold amplifier at a predetermined frequency to eliminate signal interference thereat.

8. The integrate and hold amplifier in accordance with claim 7, further comprising:
   (e) timing and control means operatively connected to said analog switch and to said capacitor discharge switch for controlling operation thereof.

9. The integrate and hold amplifier in accordance with claim 8, further comprising:
   (f) an analog-to-digital converter operatively connected to said amplifier subcircuit.

10. The integrate and hold amplifier in accordance with claim 9 wherein operation of said analog-to-digital converter is controlled by said timing and control means.

11. A system including:
    an analog signal which has a data signal component located in a relatively narrow frequency band,
    an integrate and hold circuit which samples said data signal to generate a second analog signal, said integrate and hold circuit having an integrate time which produces a frequency response with a zero located at a frequency which is aliased into said relatively narrow frequency band,
    an analog to digital converter to convert said second analog signal to a digital signal, and
    means for digitally processing said digital signal, whereby interference due to noise from higher frequencies is minimized.

12. The subsystem for reducing signal interference in accordance with claims 11 wherein a noise signal that causes the most significant interference is disposed in a second frequency interval.

13. The subsystem for reducing signal interference in accordance with claim 12 wherein a frequency region of interest, $f_r$, is approximately 66.5 kHz.

14. The subsystem for reducing signal interference in accordance with claim 13 wherein a sampling rate is approximately 133 kHz.

15. In a system with a continuous time signal input, a method for reducing signal interference comprising the steps of:
    sampling said continuous time signal at a predetermined sampling rate,
    coordinating sampling rate and integration time such that frequency response has a zero value at frequencies that are aliased into a region of interest due to the effects of sampling, thereby reducing interference.

* * * * *